(12) United States Patent
Bazes (10) Patent No.: US 7,557,625 B1
(45) Date of Patent: Jul. 7, 2009

(54) PHASE LOCKED LOOP CHARGE PUMP REFERENCE CURRENT BOOTSTRAPPING

(75) Inventor: Mel Bazes, Haifa (IL)

(73) Assignee: Marvell Israel (M.I.S.L.) Ltd. (IL)

( * ) Notice: Subject to any disclaimer, the term of this patent is extended or adjusted under 35 U.S.C. 154(b) by 0 days.

(21) Appl. No.: 11/942,624

(22) Filed: Nov. 19, 2007

Related U.S. Application Data (60) Provisional application No. 60/867,981, filed on Nov. 30, 2006.

(51) Int. Cl.
*H03L 7/06* (2006.01)

(52) U.S. Cl. .......................... 327/157; 327/148; 327/536

(58) Field of Classification Search ........................ None
See application file for complete search history.

(56) References Cited

U.S. PATENT DOCUMENTS 7,142,005 B1 * 11/2006 Gaboury ....................... 326/21

* cited by examiner

*Primary Examiner*—Cassandra Cox (57) ABSTRACT

A phase locked loop with a charge pump circuit has increased stability and phase margin. The charge pump circuit feeds back its voltage output to generate a reference current. In one embodiment, the charge pump circuit comprises a current generator responsive to a charge voltage that has been output from the charge pump. The current generator generates a reference current based on the charge voltage and a supply voltage. The reference current may comprise a bootstrap current and an auxiliary current. The charge pump circuit also comprises a current mirror that generates a source current and a sink current that are substantially the same as the reference current. The charge pump circuit further comprises a charge voltage generator to generate the charge voltage based on the source current and the sink current. A related method is also disclosed. Other embodiments are provided, and each of the embodiments can be used alone or in combination with one another.

21 Claims, 9 Drawing Sheets

PHASE LOCKED LOOP CHARGE PUMP REFERENCE CURRENT BOOTSTRAPPING

CROSS-REFERENCE TO RELATED APPLICATION

This application claims the benefit of U.S. Provisional Application No. 60/867,981, filed Nov. 30, 2006, which is hereby incorporated by reference.

TECHNICAL FIELD

The present invention relates to phase locked loops. More particularly, the present invention relates to generating reference currents in phase locked loop charge pumps.

BACKGROUND

A phase locked loop (PLL) is a negative feedback circuit that synchronizes the edges of a local clock with the edges of a reference clock. A PLL aligns the phases and frequencies of the clocks and helps to eliminate skew and jitter. A typical supply-regulated PLL includes a charge pump that translates control signals into an output voltage that controls a voltage-controlled oscillator (VCO) which outputs the local clock. The "up" and "down" control signals input into the charge pump denote when the local clock lags or leads the reference clock, respectively. If an "up" signal is received, the charge pump outputs a higher voltage that causes the VCO to output an increased frequency, and conversely, if a "down" signal is received, the charge pump outputs a lower voltage that causes the VCO to output a decreased frequency.

The charge pump relies on the generation of an internal reference current to create the output voltage that is sent to the VCO. Two current sources, a source current and a sink current, may be referenced and mirrored to the reference current, which is preferably constant over all operating conditions and manufacturing process corners, in order to improve the stability and open-loop phase margin of the PLL. The two current sources may source or sink current to vary the output voltage, based on the "up" and "down" signals. Reducing variability in the reference current directly translates into improved stability and phase margin of the PLL. Existing reference current generators may be strongly influenced by variations in the supply voltage, temperature, and/or process corner, leading to decreased stability and phase margin of the PLL. The reference current could also be generated using a circuit based on a bandgap voltage reference, but such circuits may consume significant power and require a large die area.

SUMMARY

The present invention is defined by the following claims, and nothing in this section should be taken as a limitation on those claims.

By way of introduction, the embodiments described below provide a charge pump circuit contained in a phase locked loop (PLL). The charge pump circuit has increased stability and phase margin and feeds back its voltage output to generate a reference current. The charge pump is preferably used in a PLL, but may be used in other circuits to create a higher or lower voltage power source. In one embodiment, the charge pump circuit comprises a current generator responsive to a charge voltage that has been output from the charge pump. The current generator generates a reference current based on the charge voltage and a supply voltage. The reference current may be comprised of an auxiliary current and a bootstrap current. The charge pump circuit also comprises a current mirror that generates a source current and a sink current that are substantially the same as the reference current. The charge pump circuit further comprises a charge voltage generator to generate the charge voltage based on the source current and the sink current. A related method is also disclosed.

In another embodiment, a phase locked loop comprises reference current generation means for generating a reference current based on an input charge voltage and a supply voltage, current mirror means for mirroring the reference current so that both a source current and a sink current are substantially the same as the reference current, and output charge voltage generation means for generating an output charge voltage based on the source current and the sink current. The reference current generation means comprise source follower means for generating a source voltage that substantially tracks the input charge voltage, first resistor means for generating a first current based on the source voltage, second resistor means for generating a second current based on the supply voltage, and diode-connected transistor means for generating the reference current based on the first current and the second current. The source follower means may comprise a first NMOS transistor having a gate coupled to the input charge voltage, a drain coupled to the supply voltage, and a source coupled to the first resistor means. The diode-connected transistor means may comprise a second NMOS transistor having a drain coupled to a gate and a source coupled to ground. The reference current may comprise the first current and the second current. The resistance value of the second resistor means may be substantially greater than a resistance value of the first resistor means, and the first current may be substantially greater than the second current. The current mirror means may comprise a cascode current mirror. The output charge voltage generation means may comprise a first switch means for coupling the source current and the output charge voltage to increase the output charge voltage, based on an up signal, and second switch means for coupling the sink current and the output charge voltage to decrease the output charge voltage, based on a down signal.

Other embodiments are described, and each of the embodiments described herein can be used alone or in combination with one another. Embodiments of the Applicant's device and methods, as well as implementation thereof, will now be described with reference to the attached drawings.

DETAILED DESCRIPTION OF THE PRESENTLY PREFERRED EMBODIMENTS

The disclosure can be better understood with reference to the following drawings and description. The components in the figures are not necessarily to scale, emphasis instead being placed upon illustrating the teachings of the invention. Moreover, in the figures, like-referenced numerals designate corresponding parts or elements throughout the different views.

By way of overview, the embodiments described herein relate to circuits and methods for generating a reference current in a charge pump. The charge pump is preferably used in a PLL, but may be used in other circuits to create a higher or lower voltage power source. In the circuits and methods disclosed in these embodiments, a reference current is generated in the charge pump based on the feedback of a charge voltage that is output from the charge pump. The reference current may be comprised of an auxiliary current and a bootstrap current. An auxiliary resistor always generates the auxiliary current because it is directly coupled to the supply voltage. A current mirror may mirror the auxiliary current so that a source current and a sink current are substantially the same as the auxiliary current. The source current or sink current may then produce a charge voltage. The charge voltage may be coupled to a gate of a transistor configured as a source follower, which may also be coupled to a bootstrap resistor. The resistance value of the bootstrap resistor may be relatively low compared to the resistance value of the auxiliary resistor. The bootstrap resistor generates a bootstrap current based on the charge voltage and supply voltage. The bootstrap current becomes a primary component of the reference current, and the source and sink currents become substantially the same as the reference current because of the current mirror. These circuits and methods may reduce the influence that variations in supply voltage, temperature, and process corner may have on the charge pump and the PLL. In addition, these circuits and methods may provide improved stability and phase margin for the PLL using little additional area at a low power.

Figure 1:
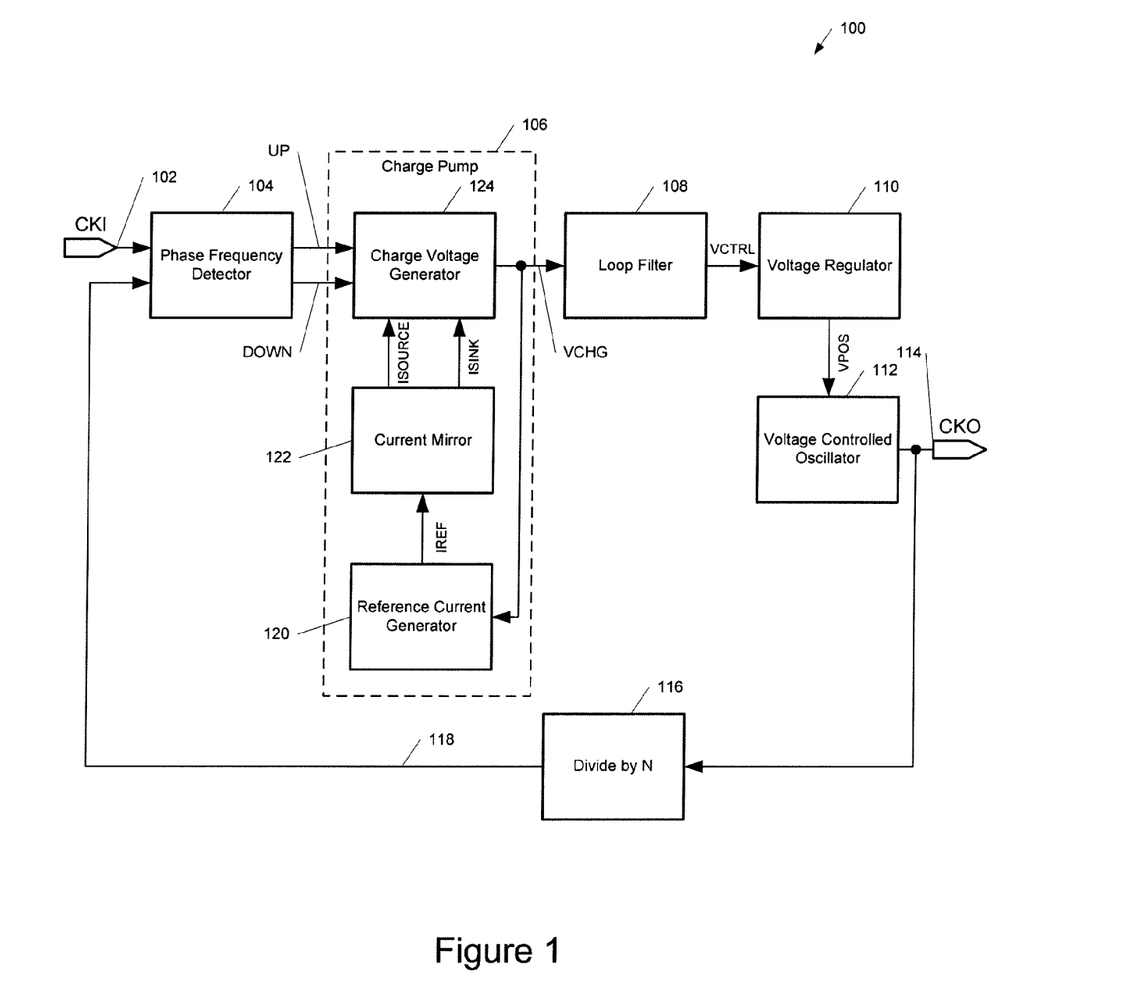
FIG. 1 is a block diagram of a phase-locked loop circuit with a charge pump of an embodiment.

FIG. 1 is a block diagram of a phase-locked loop (PLL) circuit 100. The PLL 100 may include a reference clock input CKI 102, a phase frequency detector (PFD) 104, a charge pump 106, a loop filter 108, a voltage regulator 110, a voltage-controlled oscillator (VCO) 112, a clock output CKO 114, and a divider block 116. The PFD 104 may compare the phase of the reference clock CKI 102 with the phase of a divided output clock 118. The PFD 104 may output UP or DOWN corrective control signals to the charge pump 106 which may vary the charge voltage VCHG output from the charge pump 106. The UP and DOWN control signals may comprise a pulse width modulated signal or may be another type of signal that may be provided to the charge pump 106 to vary the charge voltage VCHG. The PFD 104 outputs an UP signal when the divided output clock 118 lags the reference clock CKI 102, and outputs a DOWN signal when the divided output clock 118 leads the reference clock CKI 102. In turn, the charge pump 106 may use the UP or DOWN signals to adjust a charge voltage VCHG. The charge voltage VCHG, after filtering and regulating, may control the VCO 112 to increase or decrease the frequency of the output clock CKO 114 so that it matches the reference clock CKI 102, and so that the phase difference between the two clocks is substantially zero. If an UP signal is received by the charge pump 106, the charge voltage VCHG may increase. If a DOWN signal is received by the charge pump 106, the charge voltage VCHG may decrease.

The charge pump 106 may include a reference current generator 120, a current mirror 122, and a charge voltage generator 124. The charge pump 106 may take the UP and DOWN control signals of the PFD 104 as inputs and output the charge voltage VCHG. The charge voltage VCHG from the charge voltage generator 124 may be fed back to the reference current generator 120. The reference current generator 120 may generate the reference current IREF based on the charge voltage VCHG and the supply voltage (not shown). The current mirror 122 takes the reference current IREF and mirrors it to the current sources ISOURCE and ISINK so that they are substantially the same as the reference current IREF. The charge voltage generator 124 uses the ISOURCE and ISINK current sources, in conjunction with the UP and DOWN control signals, to generate the charge voltage VCHG.

The charge voltage VCHG is provided to the loop filter 108, which may smooth and reduce jitter in the signal. Because the charge pump 106 may abruptly change the charge voltage VCHG based on the UP and DOWN signals, the loop filter 108 may remove any high frequency components from the charge voltage VCHG using, for example, a low pass filter. The loop filter 108 may output a control voltage VCTRL to the voltage regulator 110. The voltage regulator 110 may provide a stable output voltage VPOS to the VCO 112, based on the control voltage VCTRL. In the PLL 100, the charge voltage VCHG, the control voltage VCTRL, and the voltage VPOS may be substantially the same level. The voltage VPOS is the control input to the VCO 112, and may substantially track the charge voltage VCHG and control voltage VCTRL, following filtering and regulation.

The VCO 112, based on the voltage VPOS, generates the output clock CKO 114. As the voltage VPOS increases, the frequency of the output clock CKO 114 may increase. Conversely, as the voltage VPOS decreases, the frequency of the output clock CKO 114 may decrease. As previously described, the voltage VPOS will vary in order to match the reference clock CKI 102 and the divided output clock 118, based on their comparison in the PFD 104. The output clock CKO 114 may be divided down by the divider block 116 to produce the divided output clock 118, which is used by the PFD 104 for comparison with the reference clock CKI 102. Dividing down the output clock CKO 114 results in frequency-multiplication so that the frequency of the output clock CKO 114 in the steady state is N times the frequency of the reference clock CKI 102, where N is the divisor of the divider block 116.

Figure 2:
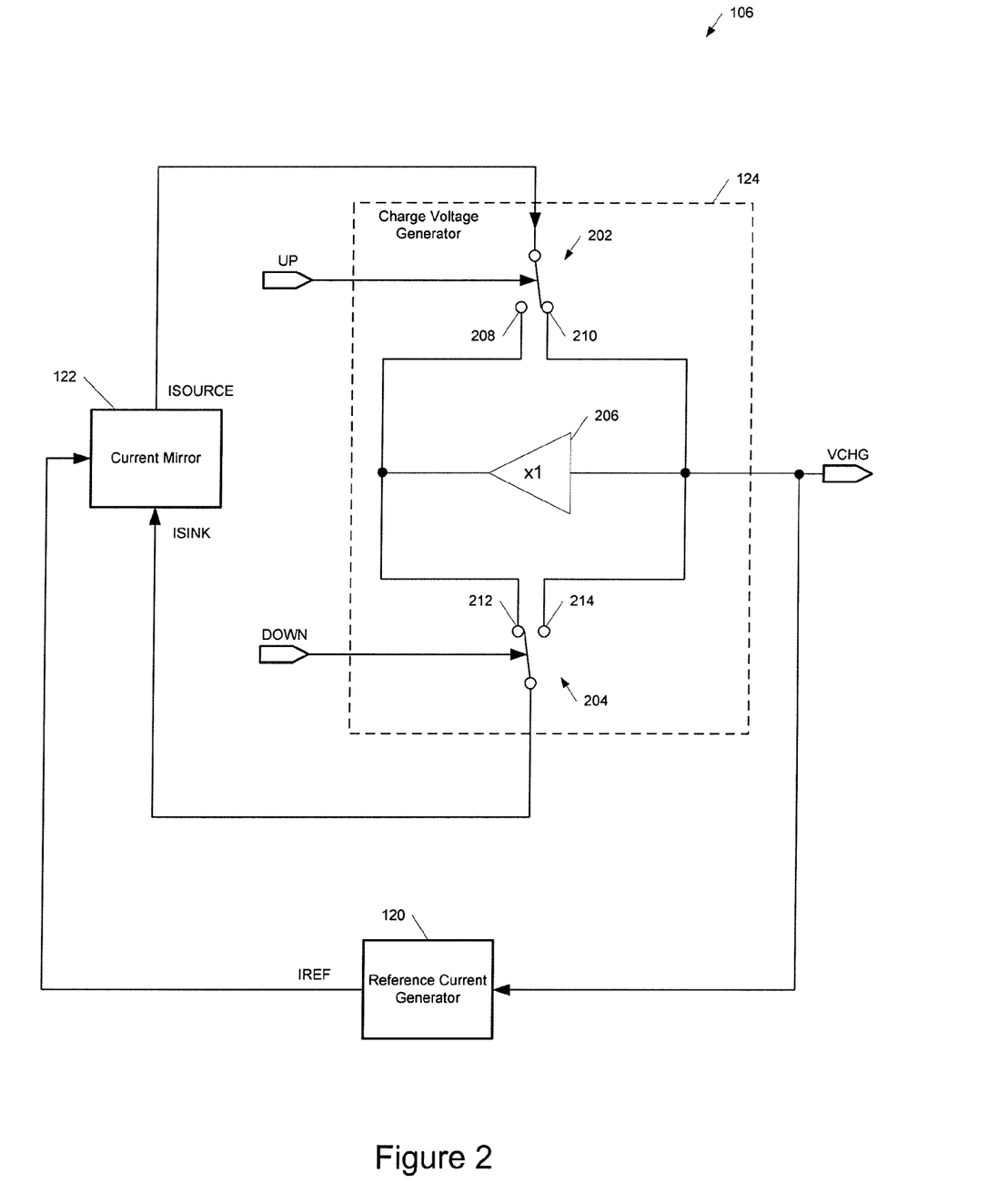
FIG. 2 is a schematic of a charge pump of an embodiment.

FIG. 2 is a schematic of a charge pump 106 in the PLL 100. The charge pump 106 may include the UP and DOWN control signals as inputs from the PFD 104, the charge voltage VCHG as an output, switches 202 and 204, and a unity gain buffer 206. The charge pump 106 may also include the reference current generator 120 that generates the IREF reference current, and the current mirror 122 that generates the ISOURCE and ISINK current sources based on the IREF reference current. The charge voltage generator 124 may comprise switches 202 and 204 and the unity gain buffer 206. In FIG. 2, the UP signal controls the switch 202 and the DOWN signal controls the switch 204 to selectively couple the current sources ISOURCE and ISINK to the charge voltage VCHG output. Other control signals and components may be used to selectively couple the current sources ISOURCE and ISINK to the charge voltage VCHG output. Therefore, the charge voltage VCHG is generated based on the source current ISOURCE or the sink current ISINK. The current mirror 122 may mirror the reference current IREF into the current sources ISOURCE and ISINK. The reference current IREF is preferably relatively invariant and constant so that the PLL 100 has improved stability and phase margin. In FIG. 2, the direction of the arrows for ISOURCE and ISINK correspond to the direction of the current flow.

The charge pump 106 of FIG. 2 with switches 202 and 204 may be configured in four different states. In the first state, when both the UP and DOWN signals are low, ISOURCE and ISINK may be coupled to nodes 208 and 212, respectively, and no current is sourced or sunk at the charge voltage VCHG. In this state, the current sources are isolated from VCHG by the unity gain buffer 206. In the second state, when the UP signal is high and the DOWN signal is low, ISOURCE may be coupled to node 210 and ISINK may be coupled to node 212. The charge pump 106 is shown in this state in FIG. 2, for example. Only current from ISOURCE, which is substantially the same as the reference current IREF, may be sourced at the charge voltage VCHG in this state. In the third state, when the UP signal is low and the DOWN signal is high, ISOURCE may be coupled to node 208 and ISINK may be coupled to node 214. Only current from ISINK, which is substantially the same as the reference current IREF, may be sunk at the charge voltage VCHG in this state. In the fourth state, when both the UP and DOWN signals are high, ISOURCE and ISINK may be coupled to nodes 210 and 214, respectively, and therefore coupled to the charge voltage VCHG. In this state, substantially no current is sourced or sunk at VCHG.

Figure 3:
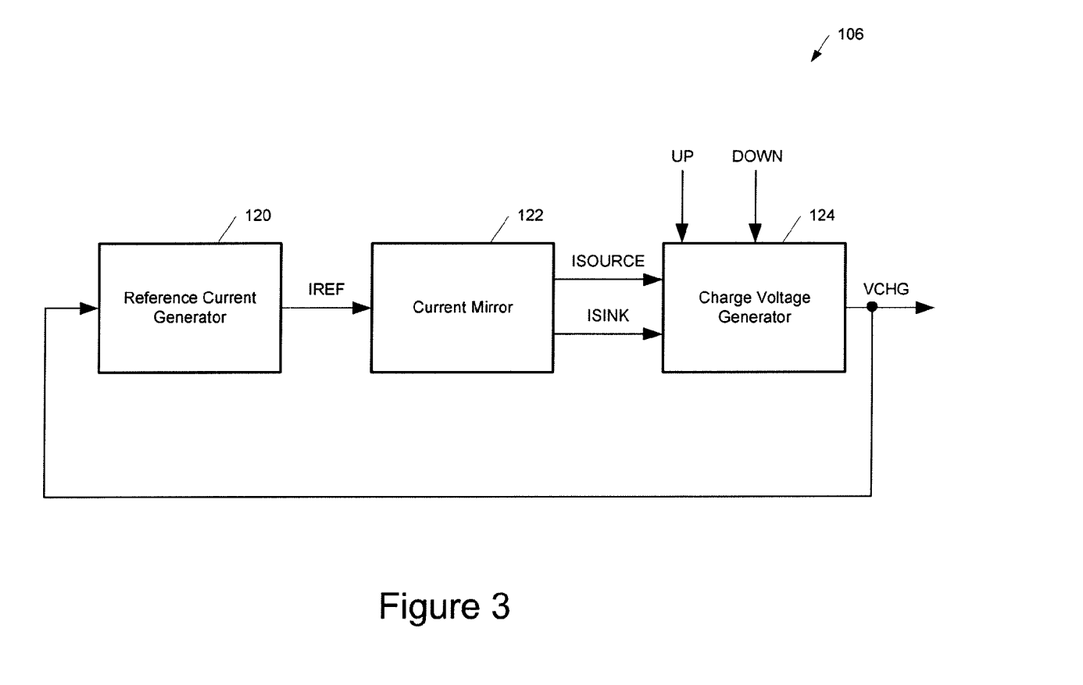
FIG. 3 is a block diagram of a charge pump of an embodiment.

FIG. 3 is a block diagram of an embodiment of a charge pump 106. The charge pump 106 may include a reference current generator 120, a current mirror 122, and a charge voltage generator 124. The charge pump 106 in FIG. 3 may take the UP and DOWN control signals of the PFD 104 as inputs and output the charge voltage VCHG. Also, the charge pump 106 may feed back the charge voltage VCHG from the charge voltage generator 124 to the reference current generator 120. The reference current generator 120 may generate the reference current IREF based on the charge voltage VCHG and the supply voltage, as described below. The supply voltage (not shown) may be the source voltage for the charge pump 106. Next, the current mirror 122 takes the reference current IREF and mirrors it to the current source ISOURCE and ISINK so that they are substantially the same as the reference current IREF. Finally, the charge voltage generator 124 uses the ISOURCE and ISINK current sources, in conjunction with the UP and DOWN control signals, to generate the charge voltage VCHG, as described above.

Figure 4:
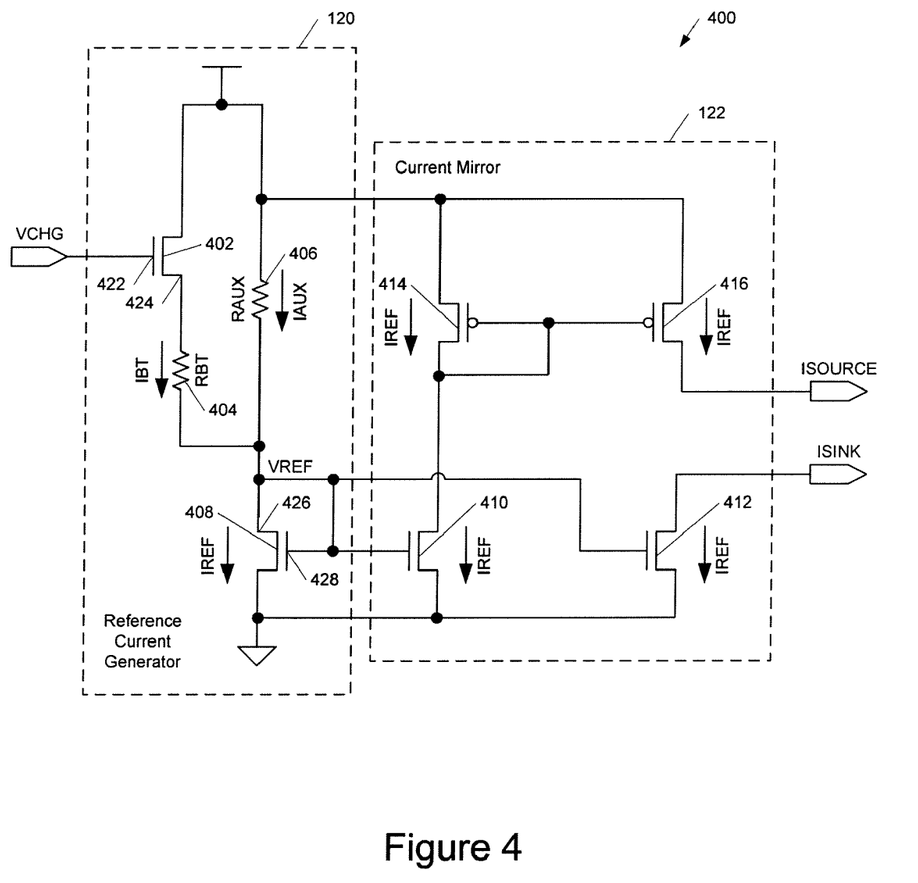
FIG. 4 is a schematic of a bootstrapped reference current generator in the charge pump of an embodiment.

FIG. 4 is a schematic of an embodiment of a bootstrapped reference current generator circuit 400 in the charge pump 106. In the embodiment of FIG. 4, the current sources ISOURCE and ISINK are generated based on feeding back the charge voltage VCHG as an input to the circuit 400. The circuit 400 may include the charge voltage VCHG as an input, an n-type transistor 402, a bootstrap resistor RBT 404, an auxiliary resistor RAUX 406, n-type transistors 408, 410, and 412, p-type transistors 414 and 416, and current sources ISOURCE and ISINK as outputs. Other combinations of active and/or passive components may be used to generate the current source ISOURCE and ISINK based on the feedback of the charge voltage VCHG.

A reference current generator 120 may comprise the n-type transistor 402, bootstrap resistor RBT 404, auxiliary resistor RAUX 406, and n-type transistor 408. The reference current generator 120 may generate a reference current IREF based on the charge voltage VCHG and the supply voltage. Other combinations of active and/or passive components may be used to generate a reference current. A current mirror 122 may comprise the n-type transistors 410 and 412, and p-type transistors 414 and 416 and may mirror the reference current IREF to the current sources ISOURCE and ISINK. The current mirror may also be implemented using cascoding or other circuit configurations and with a combination of active and/or passive components.

In FIG. 4, the reference current IREF is generated by the drain-to-source voltage drop of VREF across the diode-connected n-type transistor 408, where the drain 426 of the transistor 408 is directly coupled to the gate 428 of the transistor 408. Connected in this way, the transistor 408 operates in the saturation region and has the characteristics of a diode. The voltage VREF at the drain 426 and gate 428 of the transistor 408 is based on the charge voltage VCHG and the supply voltage. Other combinations of active and/or passive components may be used to generate the reference current IREF. Accordingly, the reference current IREF may be comprised of the bootstrap current IBT across the bootstrap resistor RBT 404, and the auxiliary current IAUX across the auxiliary resistor RAUX 406.

The auxiliary resistor RAUX 406 is coupled between the supply voltage and VREF and may assist with startup of the PLL 100. Because of this configuration, an auxiliary current IAUX across auxiliary resistor RAUX 406 always exists. The auxiliary current IAUX is independent of the charge voltage VCHG and is based only on the supply voltage. Therefore, even when VCHG is zero volts and the bootstrap current IBT is zero milliamps, such as at PLL startup, a reference current IREF with a small value exists due solely to the auxiliary current IAUX. This small reference current IREF is mirrored by the current mirror 122 to generate the current sources ISOURCE and ISINK. Consequently, ISOURCE and ISINK are used to generate the charge voltage VCHG, as described above, and VCHG becomes non-zero.

The charge voltage VCHG is coupled to the gate 422 of the n-type transistor 402. The n-type transistor 402 may be configured as a source follower, so that the voltage at its source 424 may substantially track the charge voltage VCHG at its gate 422. Other active and/or passive components or configurations of components may be used so that a voltage is generated that substantially tracks the charge voltage VCHG. The voltage drop from the source 424 of the n-type transistor 402 to the reference voltage VREF over the bootstrap resistor RBT 404 generates the bootstrap current IBT. Therefore, once the PLL 100 is operating, the auxiliary current IAUX may become a much smaller component of the reference current IREF, as the bootstrap current IBT across the bootstrap resistor RBT 404 becomes a larger component of the reference current IREF. The resistance values of the bootstrap and auxiliary resistors may be chosen such that the auxiliary resistor value is substantially greater than the bootstrap resistor value. In this way, once the PLL 100 is operating, the bootstrap current IBT may be substantially greater than the auxiliary current IAUX. For example, the bootstrap current IBT may be approximately three times greater than the auxiliary current IAUX, but other ratios between the currents may be chosen. The contribution of the auxiliary current IAUX to the reference current IREF may become insignificant and negligible. Most of the current will flow through the n-type transistor 402 and the bootstrap resistor RBT 404 due to their lower resistance relative to the resistance of the auxiliary resistor RAUX 406. As already described, the reference current IREF is mirrored by the current mirror 122 to the current sources ISOURCE and ISINK, which are then used to generate the charge voltage VCHG.

Because the current sources ISOURCE and ISINK are substantially the same as the reference current IREF, it is advantageous that the reference current IREF be relatively invariant and constant to improve stability and phase margin. As such, the embodiment in FIG. 4 includes the n-type transistor 402 configured as a source follower and controlled by the charge voltage VCHG. The n-type transistor 402 may eliminate variations in the reference current IREF created by supply voltage fluctuations by effectively isolating the bootstrap resistor RBT 404 and n-type transistor 408 from the supply voltage. As described, the primary contributors to the reference current IREF are the bootstrap resistor RBT 404 and the n-type transistor 408. In addition, the charge voltage VCHG is also largely independent of supply voltage variations because it is generated from the current sources ISOURCE and ISINK.

Another advantageous characteristic of using the n-type transistor 402 with VCHG coupled to its gate is that the charge voltage VCHG tends to increase and decrease as temperature increases and decreases, respectively, and may compensate for variations in the reference current IREF caused by temperature. This characteristic of VCHG is a result of the operation of a PLL: for example, as temperature increases, the frequency of the output clock CKO 114 from the VCO 112 decreases, and the PLL 100 compensates for this frequency decrease by increasing VCHG to cause a frequency increase from the VCO 112. In addition, as temperature increases, IREF decreases. Thus, in a PLL with a charge pump using the n-type transistor 402 with VCHG coupled to its gate, the increase in VCHG for the purpose of causing a frequency increase will also cause IREF to increase and partially compensate for the decreased IREF due to the temperature increase. The converse is also true, i.e., when the temperature decreases, VCHG also decreases but is useful in compensating for the IREF increase due to the temperature decrease.

A further advantageous characteristic of using the n-type transistor 402 with VCHG coupled to its gate is that the charge voltage VCHG tends to be higher in slower process corners and lower in faster process corners. This is again a result of the operation of a PLL: for example, in slow process corners, the frequency of the output clock CKO 114 from the VCO 112 decreases, and the PLL 100 compensates for this frequency decrease by increasing VCHG to cause a frequency increase from the VCO 112. IREF decreases in slow process corners as well. Thus, in a PLL with a charge pump using the n-type transistor 402 with VCHG coupled to its gate, the increase in VCHG for the purpose of causing a frequency increase will also cause IREF to increase and partially compensate for the decreased IREF due to the slow process corner. The converse is again also true, i.e., when in a faster process corner, VCHG is lower but is useful in compensating for the IREF increase due to the fast process corner.

Figure 5:
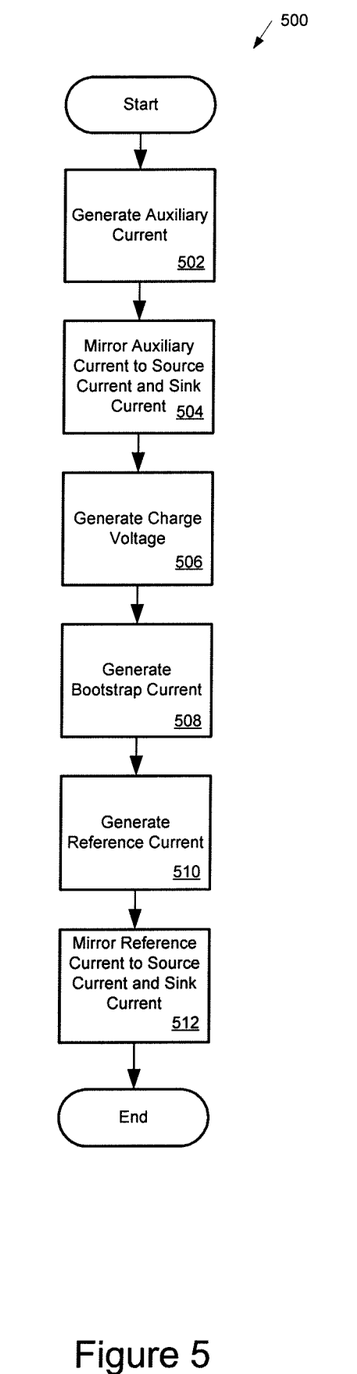
FIG. 5 is a flowchart that represents a method of the charge pump of an embodiment.

FIG. 5 is a flowchart that represents a method 500 of an embodiment of the charge pump in a PLL. An auxiliary current is generated in Step 502 based on a supply voltage. The auxiliary current may be relatively small but non-zero, and may be generated across a resistor coupled to the supply voltage or by other passive and/or active components. In Step 504, the auxiliary current is mirrored to a source current and a sink current so that they are substantially the same as the auxiliary current. A current mirror in a cascode configuration may be used to mirror the auxiliary current, or other configurations and circuits that can output a current that is substantially the same as another current may be used. A charge voltage may be output from the charge pump in Step 506, based on the source and sink currents. The charge voltage may be generated by sourcing current from the source current and sinking current from the sink current, or may be generated using other suitable circuitry.

In Step 508, a bootstrap current is generated based on the supply voltage and the feeding back of the charge voltage. The bootstrap current may be generated across an n-type transistor connected as a source follower, as well as a resistor coupled to the source of the n-type transistor. The bootstrap current may also be generated using other circuits. The bootstrap current may be relatively large compared to the auxiliary current. In Step 510, the reference current may be generated across a diode-connected n-type transistor, but may be generated using other active and/or passive components. The reference current may comprise the bootstrap current and the auxiliary current. In Step 512, the reference current is mirrored to the source current and the sink current so that they are substantially the same as the reference current.

Referring now to FIGS. 6(*a*) to 6(*h*), various exemplary implementations of the present device and methods are shown. Referring to FIG. 6(*a*), the present device may be embodied as the PLL 100 in a hard disk drive (HDD) 600, for example. HDD 600 may communicate with a host device (not shown) such as a computer, mobile computing devices such as personal digital assistants, cellular phones, media or MP3 players and the like, and/or other devices via one or more wired or wireless communication links 608 requiring a high quality signal.

The present device and methods may be implemented with either or both signal processing and/or control circuits, which are generally identified in FIG. 6(*a*) at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606. HDD 600 may be connected to memory 609, such as random access memory (RAM), a low latency nonvolatile memory such as flash memory, read only memory (ROM) and/or other suitable electronic data storage.

Referring now to FIG. 6(*b*), the present device and methods may be implemented as the PLL 100 in a digital versatile disc (DVD) drive 610, for example. The present device and methods may be implemented in either or both signal processing and/or control circuits, which are generally identified in FIG. 6(*b*) at 612, and/or mass data storage 618 of DVD drive 610. Signal processing and/or control circuit 612 and/or other circuits (not shown) in DVD drive 610 may process data, perform coding and/or encryption, perform calculations, and/or format data that is read from and/or data written to an optical storage medium 616. In some implementations, signal processing and/or control circuit 612 and/or other circuits (not shown) in DVD drive 610 can also perform other functions such as encoding and/or decoding and/or any other signal processing functions associated with a DVD drive.

Figure 6A:
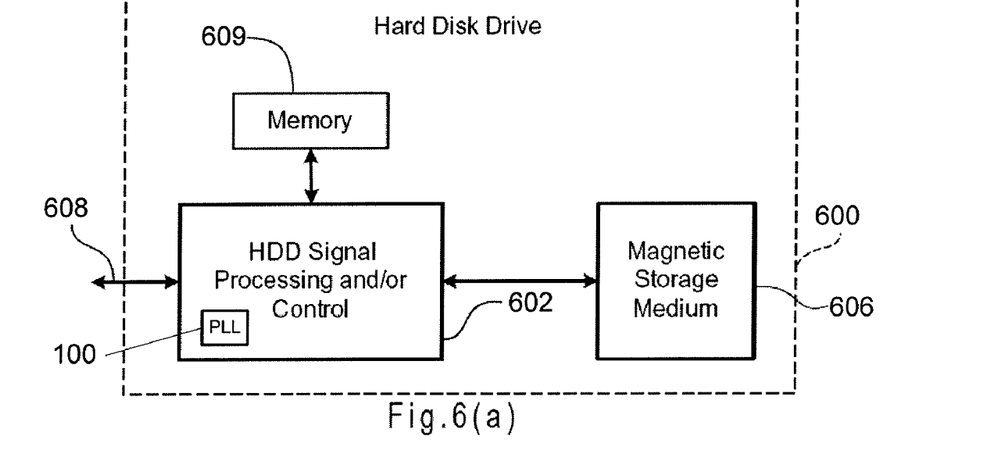
FIG. 6(a) is a functional block diagram of a hard disk drive including a PLL with a charge pump of an embodiment.
Figure 6B:
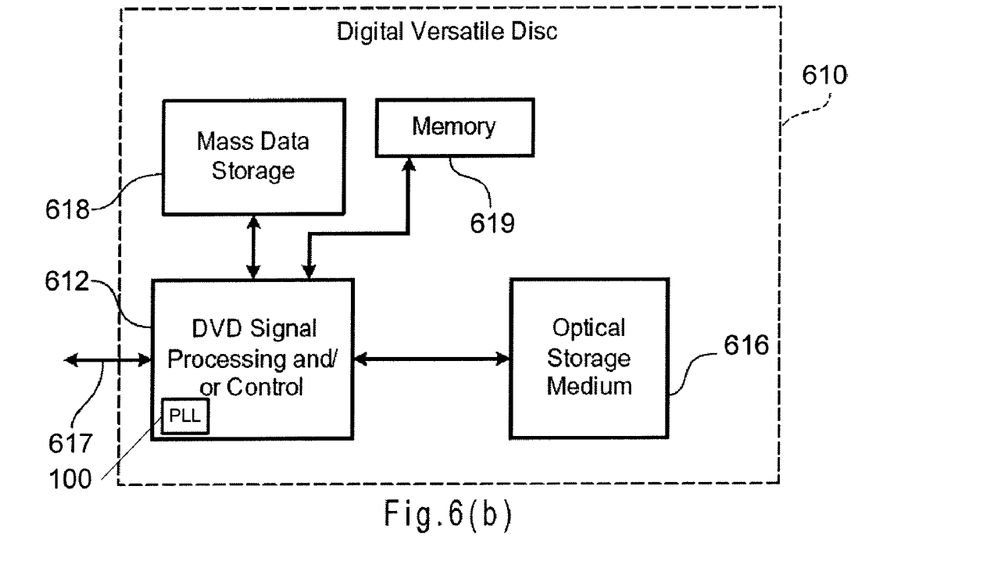
FIG. 6(b) is a functional block diagram of a digital versatile disk (DVD) including a PLL with a charge pump of an embodiment.

DVD drive 610 may communicate with a device (not shown) such as a computer, television or other device via one or more wired or wireless communication links 617 requiring a high quality signal. DVD drive 610 may communicate with mass data storage 618 that stores data in a nonvolatile manner. Mass data storage 618 may include a HDD such as that shown in FIG. 6(*a*). The HDD may be a mini HDD that includes one or more platters having a diameter that is smaller than approximately 1.8". DVD drive 610 may be connected to memory 619, such as RAM, ROM, low latency nonvolatile memory such as flash memory, and/or other suitable electronic data storage.

Figure 6C:
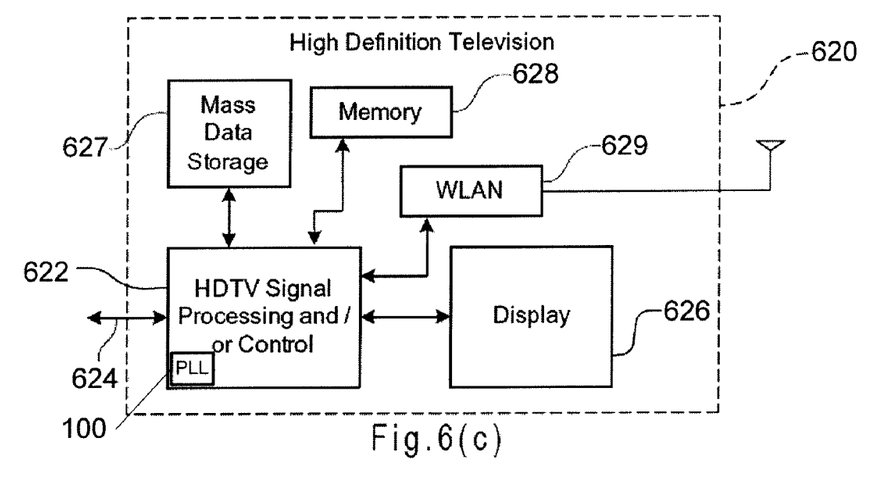
FIG. 6(c) is a functional block diagram of a high definition television including a PLL with a charge pump of an embodiment.

Referring now to FIG. 6(c), the present device and methods may be embodied as the PLL 100 in a high definition television (HDTV) 620, for example. The present device and methods may be implemented in either or both signal processing and/or control circuits, which are generally identified in FIG. 6(c) at 622, a WLAN interface 629 and/or mass data storage 627 of the HDTV 620. HDTV 620 may receive HDTV input signals in either a wired or wireless format via one or more wired or wireless communication links 624 and generate HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. At least one HDD may have the configuration shown in either FIG. 6(a) and/or at least one DVD may have the configuration shown in FIG. 6(b). The HDD may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629.

Figure 6D:
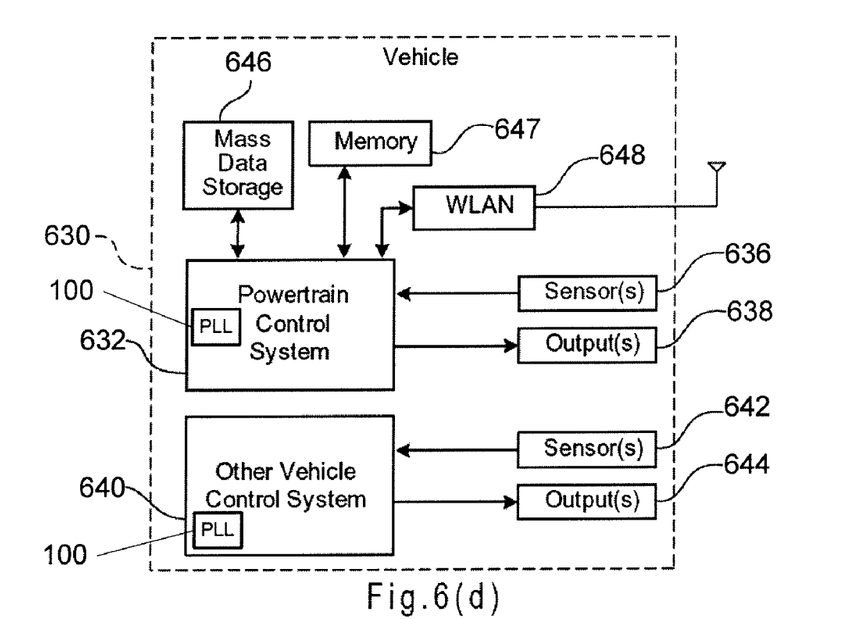
FIG. 6(d) is a functional block diagram of a vehicle control system including a PLL with a charge pump of an embodiment.

Referring now to FIG. 6(d), the present device and methods may be implemented as the PLL 100 in a control system of a vehicle 630, a WLAN interface 648 and/or mass data storage 646 of the vehicle control system, for example. In some implementations, the present device and methods are implemented in a power-train control system 632 that receives inputs from one or more sensors 636 such as temperature sensors, pressure sensors, rotational sensors, airflow sensors and/or any other suitable sensors and/or that generates one or more output control signals such as engine operating parameters, transmission operating parameters, and/or other control signals at one or more output(s) 638.

The present device and methods may also be embodied as the PLL 100 in other control systems 640 of vehicle 630. Control system 640 may likewise receive signals from input sensors 642 and/or output control signals to one or more output(s) 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices, for example HDDs and/or DVDs. At least one HDD may have the configuration shown in FIG. 6(a) and/or at least one DVD may have the configuration shown in FIG. 6(b). The HDD may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The control system 640 may also include mass data storage, memory and/or a WLAN interface (all not shown).

Figure 6E:
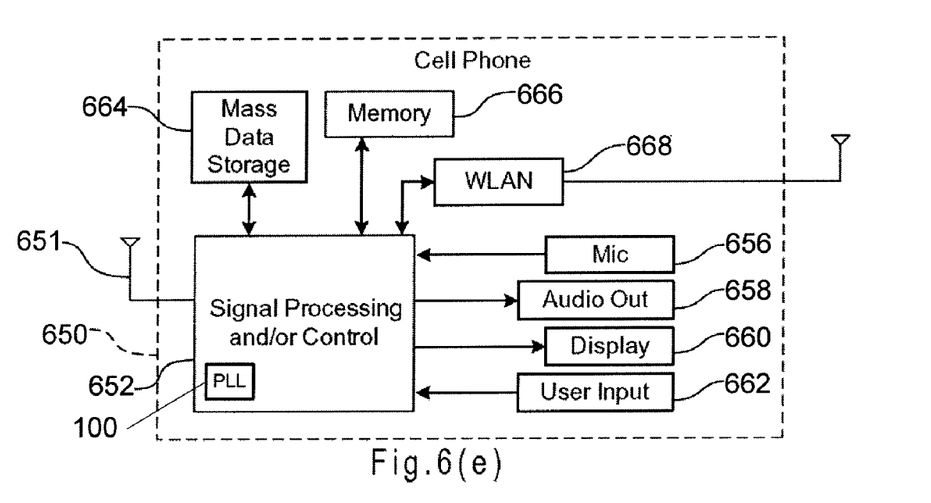
FIG. 6(e) is a functional block diagram of a cellular phone including a PLL with a charge pump of an embodiment.

Referring now to FIG. 6(e), the present device and methods may be embodied as the PLL 100 in a cellular phone 650 that may include a cellular antenna 651, for example. The present device and methods may be implemented in either or both signal processing and/or control circuits, which are generally identified in FIG. 6(e) at 652, a WLAN interface and/or mass data storage of the cellular phone 650. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices, for example HDDs and/or DVDs. At least one HDD may have a configuration shown in FIG. 6(a) and/or at least one DVD may have the configuration shown in FIG. 6(b). The HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage. Cellular phone 650 also may support connections with a WLAN via a WLAN network interface 668.

Figure 6F:
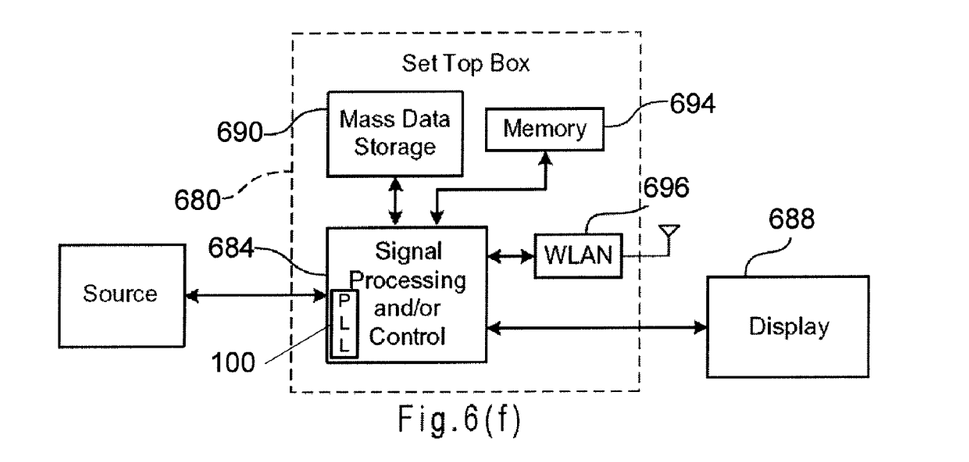
FIG. 6(f) is a functional block diagram of a set top box including a PLL with a charge pump of an embodiment.

Referring now to FIG. 6(f), the present device and methods may be embodied as the PLL 100 in a set top box 680, for example. The present device and methods may be implemented in either or both signal processing and/or control circuits, which are generally identified in FIG. 6(f) at 684, a WLAN interface and/or mass data storage of the set top box 680. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices, for example HDDs and/or DVDs. At least one HDD may have a configuration shown in FIG. 6(a) and/or at least one DVD may have the configuration shown in FIG. 6(b). The HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via a WLAN network interface 696.

Figure 6G:
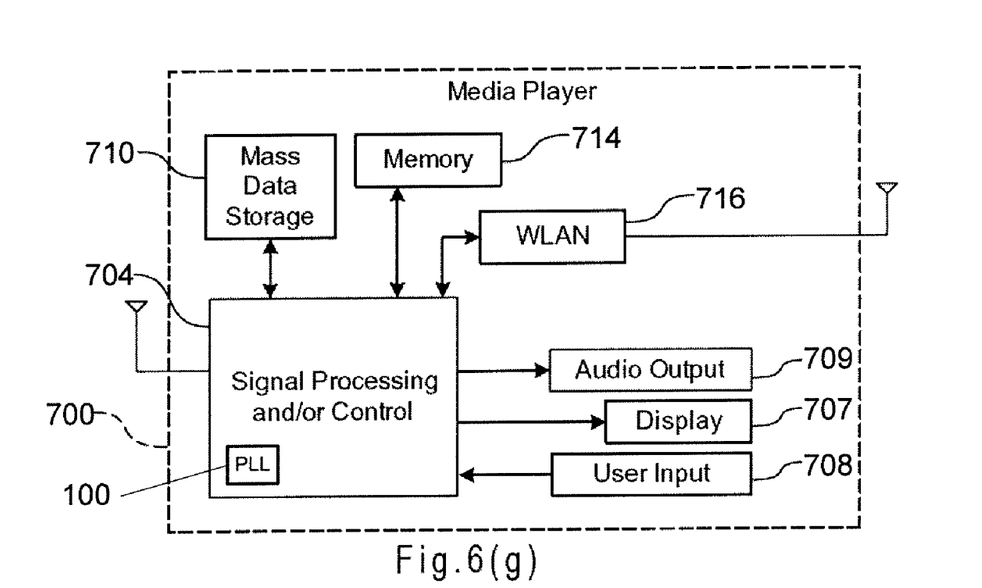
FIG. 6(g) is a functional block diagram of a media player including a PLL with a charge pump of an embodiment.

Referring now to FIG. 6(g), the present device and methods may be embodied as the PLL 100 in a media player 700, for example. The present device and methods may be implemented in either or both signal processing and/or control circuits, which are generally identified in FIG. 6(g) at 704, a WLAN interface and/or mass data storage of the media player 700. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage 710 may include optical and/or magnetic storage devices, for example HDDs and/or DVDs. At least one HDD may have a configuration shown in FIG. 6(*a*) and/or at least one DVD may have the configuration shown in FIG. 6(*b*). The HDD may be a mini HDD that includes one or more platters having a diameter that is smaller than approximately 1.8".

Media player 700 may be connected to memory 714 such as RAM, ROM, low latency nonvolatile memory such as flash memory and/or other suitable electronic data storage. Media player 700 also may support connections with a WLAN via a WLAN network interface 716. Still other implementations in addition to those described above are contemplated.

Referring to FIG. 6(*h*), the present device and methods may be embodied as the PLL 100 in a Voice over Internet Protocol (VoIP) phone 750 that may include an antenna 718, for example. The present device and methods may be implemented in either or both signal processing and/or control circuits, which are generally identified in FIG. 6(*h*) at 720, a wireless interface and/or mass data storage of the VoIP phone 750. In some implementations, VoIP phone 750 includes, in part, a microphone 724, an audio output 726 such as a speaker and/or audio output jack, a display monitor 728, an input device 730 such as a keypad, pointing device, voice actuation and/or other input devices, and a Wi-Fi communication module 732. Signal processing and/or control circuits 720 and/or other circuits (not shown) in VoIP phone 750 may process data, perform coding and/or encryption, perform calculations, format data and/or perform other VoIP phone functions.

Figure 6H:
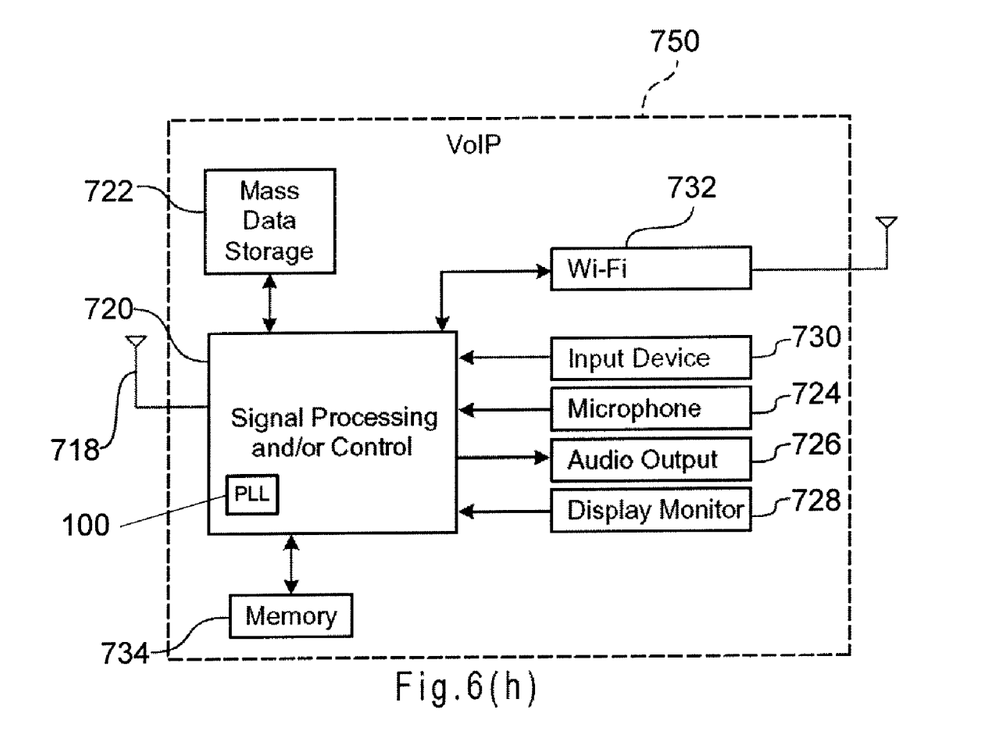
FIG. 6(h) is a functional block diagram of a VoIP phone including a PLL with a charge pump of an embodiment.

VoIP phone 750 may communicate with mass data storage 722 that stores data in a nonvolatile manner such as optical and/or magnetic storage devices, for example HDDs and/or DVDs. At least one HDD may have a configuration shown in FIG. 6(*a*) and/or at least one DVD may have the configuration shown in FIG. 6(*b*). The HDD may be a mini HDD that includes one or more platters having a diameter that is smaller than approximately 1.8". VoIP phone 750 may be connected to memory 734, which may be a RAM, ROM, low latency nonvolatile memory such as flash memory and/or other suitable electronic data storage. VoIP phone 750 is configured to establish communications link with a VoIP network (not shown) via Wi-Fi communication module 732.

All of the discussion above, regardless of the particular implementation being described, is provided as a teaching example and not intended to be limiting. Although specific components of the phase locked loop are described, methods, systems, and articles of manufacture consistent with the phase locked loop may include additional or different components. For example, components of the phase locked loop may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the phase locked loop may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that embody the invention and not as a definition of the invention. It is only the following claims, including all equivalents, that are intended to define the scope of this invention.

What is claimed is:

1. A phase locked loop, comprising:
    a frequency detector having inputs responsive to an input clock and an output clock and configured to generate an up control signal and a down control signal;
    a voltage generator having inputs responsive to the up control signal, the down control signal, a source current, and a sink current and configured to generate a charge voltage;
    a current generator having an input responsive to the charge voltage and configured to generate a reference current based on the charge voltage and a supply voltage;
    a current mirror having an input responsive to the reference current and configured to generate the source current and the sink current such that both the source current and the sink current are substantially the same as the reference current; and
    an oscillator having an input responsive to a regulated output charge voltage and configured to generate the output clock, the regulated output charge voltage based on the charge voltage.

2. The phase locked loop of claim 1, wherein the current generator comprises:
    a transistor configured as a source follower so that a voltage at a first node of the transistor substantially follows the charge voltage at a gate of the transistor;
    a first resistor coupled to the first node of the transistor, the first resistor configured to generate a first current based on the voltage at the first node of the transistor;
    a second resistor coupled to the supply voltage and arranged in parallel to the transistor and the first resistor, the second resistor configured to generate a second current based on the supply voltage; and
    a diode-connected transistor coupled to the first resistor and the second resistor, the diode-connected transistor configured to generate the reference current based on the first current and the second current.

3. The phase locked loop of claim 2, wherein the transistor comprises a first NMOS transistor; the first node of the transistor comprises a source of the first NMOS transistor; and a second node of the transistor comprises a drain of the first NMOS transistor, the second node coupled to the supply voltage.

4. The phase locked loop of claim 2, wherein the diode-connected transistor comprises a second NMOS transistor having a drain coupled to a gate and a source coupled to ground.

5. The phase locked loop of claim 2, wherein the reference current comprises the first current and the second current.

6. The phase locked loop of claim 2, wherein a resistance value of the second resistor is substantially greater than a resistance value of the first resistor.

7. The phase locked loop of claim 2, wherein the first current is substantially greater than the second current.

8. The phase locked loop of claim 1, further comprising:
a filter configured to filter the charge voltage and generate a control voltage that is substantially the same as the charge voltage; and
a regulator configured to regulate the control voltage and generate the regulated output charge voltage, the regulated output charge voltage being substantially the same as the control voltage.

9. The phase locked loop of claim 1, wherein the current mirror comprises a cascode current mirror.

10. The phase locked loop of claim 1, wherein the voltage generator comprises:
a first switch configured to couple the source current and the charge voltage to increase the charge voltage, based on an up signal; and
a second switch configured to couple the sink current and the charge voltage to decrease the charge voltage, based on a down signal.

11. The phase locked loop of claim 1, where the phase locked loop is in communication with an electronic device driven by a clock.

12. A method of generating an output clock in a phase locked loop comprising:
receiving an input charge voltage;
generating a reference current based on the input charge voltage and a supply voltage;
mirroring the reference current so that both a source current and a sink current are substantially the same as the reference current;
generating a charge voltage based on the source current and the sink current; and
generating the output clock based on a regulated output charge voltage, the regulated output charge voltage based on the charge voltage.

13. The method of claim 12, wherein generating the reference current comprises:
generating a source voltage that substantially tracks the input charge voltage;
generating a first current based on the source voltage;
generating a second current based on the supply voltage; and
providing the reference current based on the first current and the second current.

14. The method of claim 13, wherein generating the source voltage comprises using an NMOS transistor having a gate coupled to the input charge voltage, a drain coupled to the supply voltage, and a source coupled to the first resistor.

15. The method of claim 13, wherein providing the reference current comprises using a diode-connected NMOS transistor having a drain coupled to a gate and a source coupled to ground.

16. The method of claim 13, wherein the reference current comprises the first current and the second current.

17. The method of claim 13, wherein generating the first current comprises using a first resistor and generating the second current comprises using a second resistor, and wherein a resistance value of the second resistor is substantially greater than a resistance value of the first resistor.

18. The method of claim 13, wherein the first current is substantially greater than the second current.

19. The method of claim 12, wherein generating the output clock comprises:
filtering the charge voltage;
generating a control voltage that is substantially the same as the charge voltage; and
regulating the control voltage to generate the regulated output charge voltage, the regulated output charge voltage being substantially the same as the control voltage.

20. The method of claim 12, wherein mirroring the reference current comprises using a cascode current mirror.

21. The method of claim 12, wherein generating the charge voltage comprises:
coupling the source current and the charge voltage to increase the charge voltage, based on an up signal; and
coupling the sink current and the charge voltage to decrease the charge voltage, based on a down signal.

* * * * *